FIG. 1
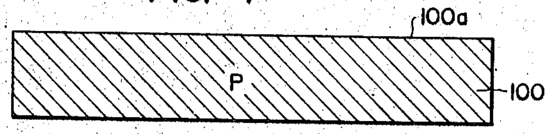
FIG. 2
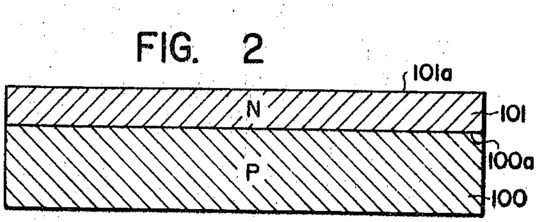
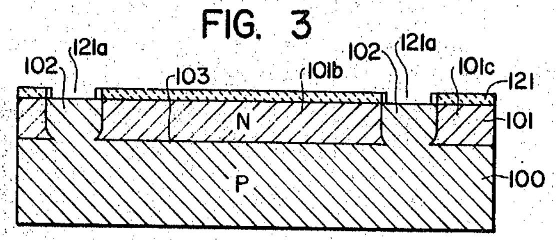
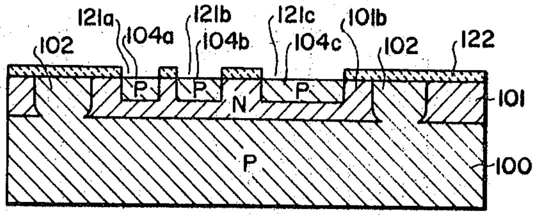
FIG. 4
FIG. 5
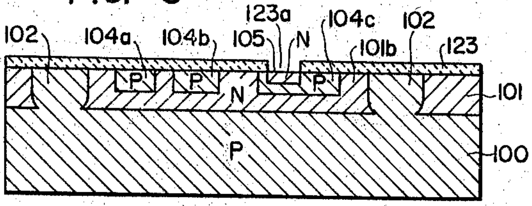
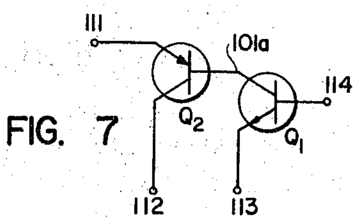
FIG. 6
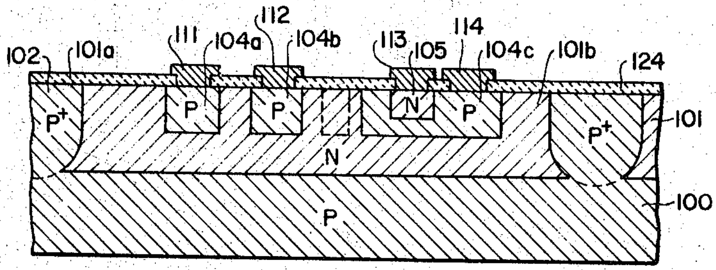
FIG. 8(A)
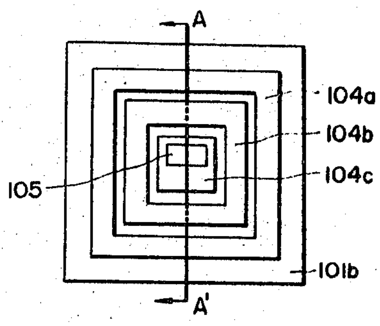
FIG. 8(B)
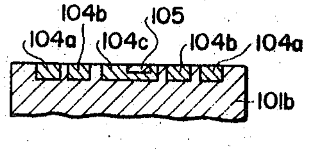
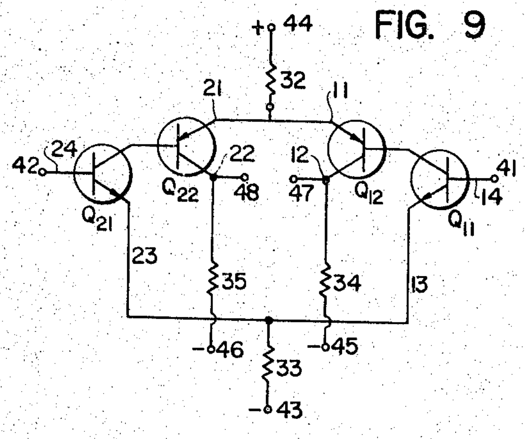
INVENTOR: MINORU NAGATA
BY: Paul M. Craig, Jr.
ATTORNEY FIG. 12
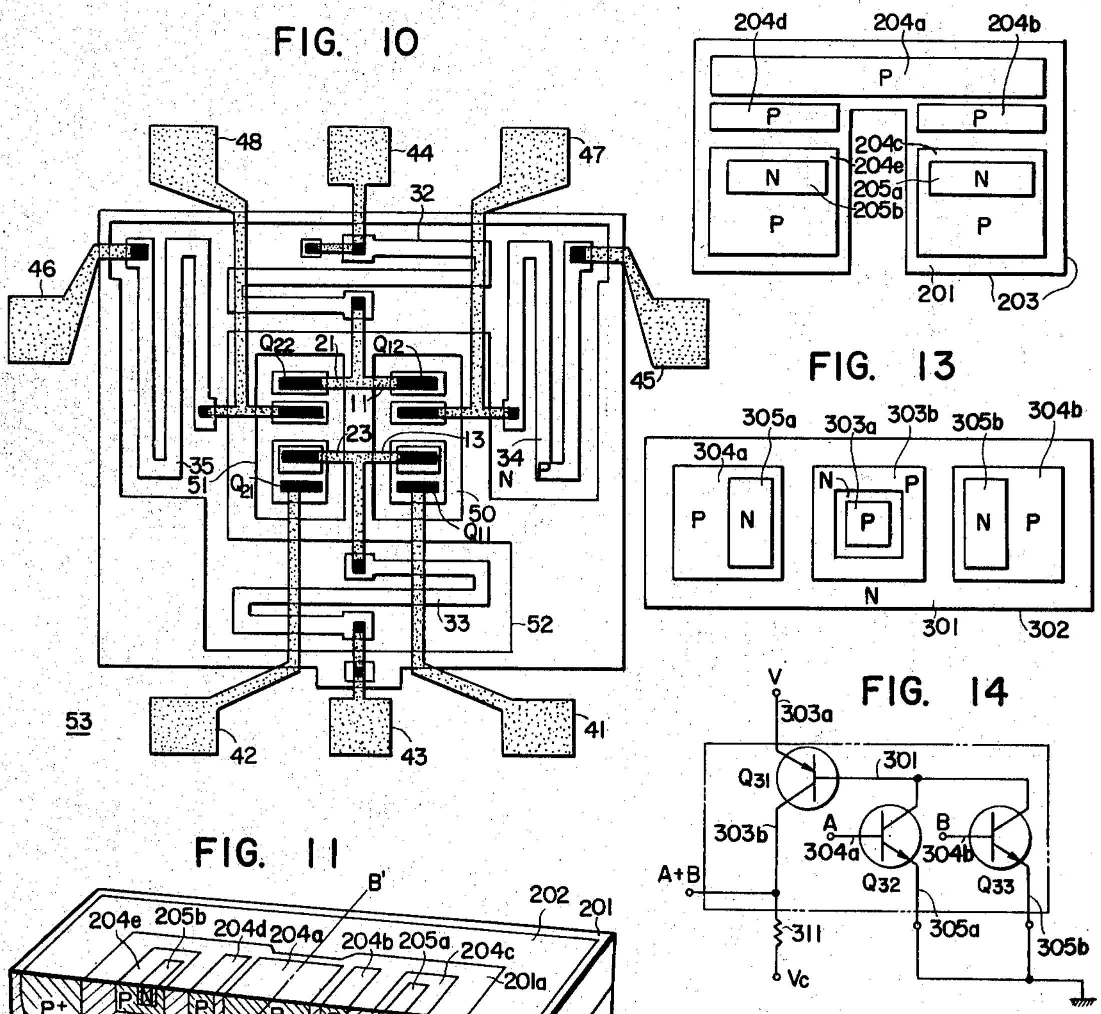
FIG. 10, FIG. 13, FIG. 14
FIG. 11
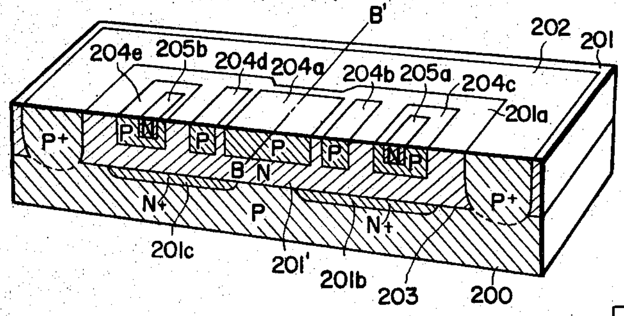
FIG. 15
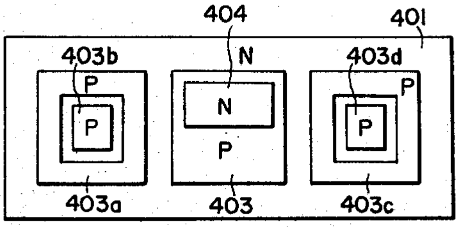
FIG. 16
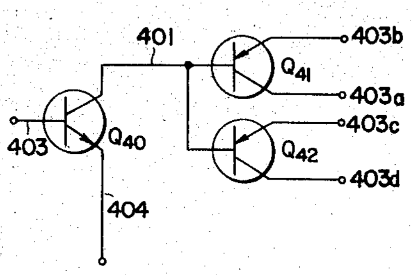
INVENTOR: MINORU NAGATA
BY: Paul M. Craig, Jr.
ATTORNEY

United States Patent Office 3,564,443
Patented Feb. 16, 1971

3,564,443

SEMICONDUCTOR INTEGRATED CIRCUIT DEVICE CONTAINING LATERAL AND PLANAR TRANSISTOR IN A SEMICONDUCTOR LAYER

Minoru Nagata, Kodaira-shi, Japan, assignor to Hitachi, Ltd., Tokyo-to, Japan

Filed June 29, 1967, Ser. No. 649,948
Claims priority, application Japan, June 29, 1966, 41/41,819
Int. Cl. H03f *3/14;* H03k *3/26*
U.S. Cl. 330—38 13 Claims

ABSTRACT OF THE DISCLOSURE

A semiconductor device having a structure wherein, by diffusing an N-type impurity in a P-type semiconductor substrate, an N-type semiconductor layer which comprises an isolated semiconductor bulk region, is formed on one of the surfaces of the substrate and is electrically isolated from said substrate. By diffusing a P-type impurity at three positions in said N-type semiconductive layer, first, second and third P-type regions that are laterally interlaid are formed. By diffusing an N-type impurity into the surface of the third P-type region, a fourth N-type region is formed. As a result of this arrangement, a PNP-type lateral transistor in which said first P-type region, said second P-type region and said N-type semiconductive layer serve as an emitter, a collector and a base, respectively; and a NPN-type double diffused planar transistor in which said third P-type region, said fourth N-type region and said N-type semiconductive layer serve as a base, an emitter and a collector, respectively, are obtained in the bulk region provided by the semiconductive layer and, furthermore, the base of the lateral transistor is electrically connected internally to the collector of the planar transistor through the bulk region provided by the semiconductive layer.

BACKGROUND OF THE INVENTION

(1) Field of invention

This invention relates to a semiconductor device and also to an integrated circuit device in which said semiconductor device is employed.

More particularly, the invention relates to a semiconductor device formed by a bulk semiconductive layer of single conductivity type monocrystalline semiconductor, in which two different type transistor structures, namely NPN-type and PNP type, are formed, and are internally interconnected.

(2) Description of prior art

Conventionally, various technical means have been suggested with respect to the construction of very minute devices having the function of electric circuits in which plural electric circuit-elements are formed as one body in a substrate made of semiconductor or insulator. Such circuit components integrated in the manner mentioned above are the result of the advancement in manufacturing techniques for semiconductor devices such as transistors and are known as monoblock circuit devices.

The vital point in the manufacturing techniques for transistors lies in the impurity diffusion process. In integrated circuit components of the kind described above, importance is placed on the design of the structure so that the number of necessary diffusion processes can be reduced and made easy, and sure to materialize into a workable integrated circuit structure. With respect to this subject, U.S. Pat. No. 3,197,710 issued to Hung Chang Lin for complementary transistor structures on July 27, 1965, is one of the known prior art patents directed toward the solution of the same problem.

The primary purpose of the patent to Lin is to provide a unitary semiconductor structure capable of performing the functions of a complementary pair of transistors that may serve as a PNP planar transistor by employing a PNP lateral transistor and a NPN planar transistor.

In the above patent, two surface bulk regions of N-type semiconductor which are electrically isolated from each other, are disposed on the surface of a P-type semiconductor substrate. In one of these regions, a P-type impurity is diffused at two points closely adjacent to but laterally spaced from each other so that a PNP lateral transistor is formed. In the other region, a P-type impurity is diffused at first, and then an N-type impurity is diffused into the P-type region so that an NPN planar transistor is formed.

In the resulting structure, with regard to the PNP lateral transistor, the N-type semiconductor surface bulk region serves as the base, and two P-type regions, which are disposed laterally and closely adjacent each other on the surface of the N-type bulk region during the base region forming process of said NPN planar transistor, serve as the emitter and the collector, respectively. From transistors of this type, however, high gains for current-amplification cannot be obtained in view of its construction, unlike the conventional planar type transistor. For the purpose of eliminating this disadvantage, in the Lin patent signals obtained at the collector of the PNP lateral transistor are applied further to the base of the NPN planar transistor, so that the transistor as a whole may provide a current amplification which is equal to that of conventional planar transistors. For this purpose, the emitter and the collector of the PNP lateral transistor are connected with the collector and the base of the NPN planar transistor respectively, through externally deposited conductor means so as to cause the structure as a whole to function as a PNP-type planar transistor.

SUMMARY OF THE INVENTION

One object of the present invention is to provide a lateral transistor structure effectively combined with a planar transistor in such a manner as to provide a monoblock semiconductor device which can be easily manufactured, and is free from level shift between input and output signal.

Another object of the invention is to provide a semiconductor device comprised of one block of semiconductor material wherein plural transistor elements are formed in an electrically isolated state in a manner such that the substrate area needed for composing an entire circuit is reduced.

A further object of the invention is to provide a semiconductor device having the above recited characteristics, and which possesses the function of a linear circuit.

A further object of the invention is to provide a semiconductor device having the function of logical circuit in which plural transistor elements and means for electrically separating each element are formed in one block of a single conductivity type, bulk semiconductor.

A characteristic feature of semiconductor devices constructed in accordance with this invention is that the base of at least one lateral transistor with single conductive polarity such as PNP type, is internally connected with the collector of at least one planar transistor having another conductive polarity such as NPN type, so that they may form an electric circuit for serving as the basic component of the device and, in addition, a unitary composition of the circuit is made possible by forming it in a semiconductor bulk member of single conductivity type.

These and other objects and features of this invention will be better understood upon consideration of the following detailed description and the accompanying drawings, in which:

BRIEF DESCRIPTION OF THE DRAWINGS

FIGS. 1 through 6 illustrate a fundamental embodiment of a semiconductor device of this invention and illustrate its manufacturing process;

FIG. 7 is an equivalent circuit of a semiconductor device based upon the device described in the preceding figures;

FIGS. 8(A) and 8(B) show another fundamental embodiment wherein FIG. 8(A) is a plan view of the semiconductor device and 8(B) shows briefly a sectional view of the same taken through axis A–A′ in 8(A);

FIG. 9 is an example of a linear circuit composed of the fundamental circuit shown in FIG. 7;

FIG. 10 is a plan of an embodiment of a monoblock semiconductor device wherein the linear circuit shown in FIG. 9 is assembled in one block on a semiconductor substrate;

FIG. 11 is a sectional view of essential parts of another embodiment of a monoblock semiconductor device wherein a different form of the linear circuit shown in FIG. 9 is assembled in one block on a semiconductor substrate;

FIG. 12 illustrates a modified example of the semiconductor device shown in FIG. 11;

FIG. 13 illustrates an embodiment of a semiconductor device having a logic circuit function obtained by this invention;

FIG. 14 is an equivalent circuit of the embodiment shown in FIG. 13;

FIG. 15 illustrates another embodiment of this invention; and

FIG. 16 is an equivalent circuit of the semiconductor device shown in FIG. 15.

DETAILED DESCRIPTION OF PREFERRED EMBODIMENT

A semiconductor device composed of one block is formed on a monocrystalline semiconductor bulk region that in turn is formed on a substrate of semiconductor or insulator material in an electrically isolated state, so as to prevent each element constituting a circuit from undesirable electric mutual coupling.

As for the isolated bulk region, various methods of forming such bulk regions are known. However embodiments of this invention will be hereinafter described by referring to the case wherein said bulk region is disposed on the surface of a monocrystalline silicon substrate and an integrated circuit is formed by the use of the bulk region.

For the monocrystalline silicon substrate, a silicon plate, for instance, of 200$\mu$ in thickness and about 8Ω-cm. in specific resistance is provided. In FIG. 1, the numeral 100 designates this substrate. A main surface 100*a* of said substrate 100 is treated through such surface-cleaning processes as deoiling by known means such as removing oxide by chemical etching, and so forth.

After the above processes have been completed, a monocrystalline structure is disposed on the surface by virtue of epitaxial growth. For the conductivity type of said substrate 100, a type is generally chosen which will permit formation of a P–N junction with respect to an epitaxial layer disposed on a main surface 100*a* of the substrate. Usually, the epitaxial layer is chosen to be N-type, and the basic plate is P-type. FIG. 2 shows a structure after having an epitaxial layer 101 formed on a main surface 100*a* of the substrate 100. The epitaxial layer 101 comprises a semiconductive layer in which a bulk region suitable for having integrated circuit elements formed thereon, can be defined.

The epitaxial layer 101 is an extension of the monocrystalline structure of the substrate 100. This epitaxial layer can usually be formed by thermal decomposition of a semiconductor compound, such as by reduction of silicon tetrachloride at 1200° C. using hydrogen. Through three growing processes, the epitaxial layer 101 is doped with impurities appropriate to provide N-type conductivity, together with a gas reactive agent. The epitaxial layer 101 is provided with a main face 101*a* having a thickness, for example, about 10$\mu$ which is sufficient for forming a double diffusion structure thereon when diffusing impurities into said main face 101*a*. For the epitaxial layer 101, the specific resistance may be appropriately chosen to be within 0.1 to 10Ω-cm. In the fundamental embodiment of this invention, 1Ω-cm. is adopted as the specific resistance for epitaxial layer 101.

In the structure shown in FIG. 3, a first oxide-film mask having portions 121*a* at which the mask has selectively been removed, is formed on the surface 101*a* of the epitaxial layer 101. An acceptor impurity is diffused into the epitaxial layer exposed at portions 121*a* where said film mask is removed. This diffusion is continued until barrier walls 102 produced as a result of inversion of the exposed parts of layer 101 into P-type reaches the basic plate 100. Thus a part 101*b* of N-type epitaxial layer 101 is sectioned by the P–N junction 103 formed from the basic plate 100 and other parts of the N-type epitaxial layer, so that the part 101*b* comprises a surface bulk region or semiconductive layer which is electrically isolated. In general, boron is used as an impurity to form the barrier 102. On this occasion, the impurity concentration is chosen in such manner that the amount of atoms in 1 cm.$^3$ will be about $10^{20}$. For the purpose mentioned above, any impurity concentration which will invert the N-type conductivity of the epitaxial layer 101 into P-type is sufficient.

Forming of the oxide film coating 121 and selective removal of said film coating at points 121*a* may be performed through conventional thermal oxidation treatment and photographic etching techniques. The barrier 102 is about 20–40$\mu$ wide, and formed into a frame-shape in the epitaxial layer 101. That is, the area occupied by said barrier region on the surface of the semiconductor substrate may not be negligible. For a device of this kind, it is desirable to form many elements as far as circumstances permit on a certain defined surface bulk region. Accordingly the useless area occupied by the barriers should be as small as possible so as to utilize more of the substrate face. This invention sufficiently satisfies this requirement because only one isolated area 101*b* is required.

In the structure shown in FIG. 4, a second oxide film mask 122 having at least three holes is provided on the surface of the surface bulk region of epitaxial layer 101*a*. An acceptor impurity is then diffused through these holes so that a first, a second, and a third P-type region 104*a*, 104*b* and 104*c* are respectively formed. Each of these P-type regions forms a P–N junction with N-type epitaxial layer 101*b*. As a diffusing impurity, boron is employed, and the diffusion depth in each of P-type regions 104*a*, 104*b* and 104*c* is chosen to be about 2–3$\mu$. Impurity concentration in each P-type region is about $10^{18}$–$10^{14}$ in the amount of atoms per 1 cm.$^3$, where the specific resistance of surface portion is approximately 200Ω/□. In one specific embodiment, the mask holes on the oxide film coating 122 provided for forming P-type regions are so aligned that the distance between the first hole 121*a* and the second hole 121*b* is 10$\mu$, and that between the second hole 121*b* and the third hole 121*c* is 40$\mu$. Since the impurity diffused in the epitaxial layer 101*b* through the holes on the oxide film coating enters into the epitaxial layer 101*b* beneath the oxide film along the hole edges of the film mask, the P-type regions formed therein actually give a distance of 4$\mu$ between 104*a* and 104*b*, and 34$\mu$ between 104*b* and 104*c* at the surface. In the drawing, the second P-type region 104*b* is positioned between the first P-type region 104*a* and the third P-type region 104*c*.

However, preferably the third region is formed so as to be surrounded by the first P-type region 104*a*. The structure can operate as a PNP type lateral transistor by letting the first P-type region 104*a*, the second P-type region 104*b* and the N-type epitaxial layer 101*a* which is interposed between said two regions serve as the emitter, the collector and the base, respectively. Thus, a first transistor substructure is constituted.

Referring to FIG. 5, a third oxide film mask 123 having a hole 123*a* is provided on the third P-type region. An N-type emitter region 105 is formed, by diffusing a donor impurity into the surface of the said third P-type region 104*c*. The diffusion depth of said impurity should be about 1.5–2.5$\mu$ and the width (the base width) between this N-type region and the P-type region 104*c* approximately 0.5–1$\mu$. After the diffusion process, the N-type region 105, the P-type region 104*c*, and the N-type epitaxial layer 101*b* are used as the emitter, the base and the collector respectively, of a second sub-structure operable as a NPN type planar transistor.

FIG. 6 shows a semiconductor device composed by joining each terminal point of 111, 112, 113, and 114 to every impurity diffused region, manufactured through processes as mentioned above, of 104*a*, 104*b*, 104*c* and 105, respectively. The joints are formed, through openings in the oxide film coating which is useful for the protection of the P-N junction terminated at the surface 101*a*, by conventional means, for instance, deposition of conductive substances such as aluminum.

A semiconductor device thus obtained in accordance with this invention has a PNP lateral transistor structure and an NPN planar transistor structure in one semiconductor bulk region 101*b* of N-type. As a result, the N-type semiconductor layer or bulk region 101*b* serves in common as the base region of the lateral transistor, and as the collector region of the planar transistor. Further advantages of this invention will be described below.

By reason of 104*b* which is one of three P-type regions 104*a*, 104*b*, and 104*c* aligned in one row, and interposed between 104*a* and 104*c* 104*b* can be the collector of said lateral transistor, and the combined circuit structure can be operated as shown in FIG. 7. In FIG. 7 the collector signal of an NPN planar transistor $Q_1$ is applied to the base of a PNP lateral transistor $Q_2$ so that the operation of $Q_2$ is controlled by $Q_1$, and is easily obtained in overall structure having an extremely compact size. In FIG. 7, terminal or circuit connection designations for each transistor are the same as those given to the same circuit connections in FIG. 6.

Connection of the semiconductor device shown in FIG. 6 in a manner in which the P-type region 104*b* is especially chosen as the collector of the lateral transistor is significant. If said P-type region 104*b* were chosen as the emitter of the lateral transistor and the other P-type region 104*a* as the collector, the semiconductor device would lose its ability to function in a combination circuit such as shown in FIG. 7 composed of a PNP transistor and an NPN transistor. In other words, the carriers injected from the second P-type region 104*b* would reach the third P-type region 104*c* which functions as the base of the planar transistor rather than the first P-type region 104*a* which should function as the collector, so that the semiconductor device may operate as a PNPN type diode through the regions 104*b*, 101*a*, 104*c*, and 105.

In order to eliminate entirely the possible functioning of the device as a PNPN diode and to raise the collector efficiency of the lateral transistor, it is preferable to form a lateral transistor wherein the second P-type region 104*b* serving as the collector of the lateral transistor is arranged to surround the planar transistor and the first P-type region 104*a* serving as the emitter of the lateral transistor is arranged to surround the second P-type region 104*b* respectively. FIGS. 8 (A) and 8 (B) show an example of such arrangement.

As has been described, this invention has the advantage that a planar transistor and a lateral transistor are formed in one and the same semiconductor layer or bulk region. Hence, only one bulk region is required to provide the circuit shown in FIG. 7. This can be achieved by providing a frame-shape barrier 102, in case of obtaining the bulk region by a means such as described with relation to FIG. 3 wherein the bulk region 101*b* is isolated from the remainder of the epitaxial layer 101 formed on the semiconductor substrate.

FIG. 9 shows an example of a differential amplifier utilizing combined circuits each comprising an NPN transistor $Q_1$ and a PNP transistor $Q_2$ as illustrated and described with relation to FIGS. 6 and 7. This circuit comprises two elementary circuits: one comprised by transistors $Q_{11}$ and $Q_{12}$ and the other by transistors $Q_{21}$ and $Q_{22}$. The circuit shown in FIG. 7 is used for each elementary circuit of the differential amplifier shown in FIG. 9. In this differential amplifier, each input circuit is provided with an NPN transistor $Q_{11}$ or $Q_{21}$. The signal input terminals 41 and 42 are led to the bases 14 and 24. Emitters 13 and 23 of said transistors are connected electrically to a common node and are led via a resistance element 33 to a terminal 43 which is to be connected to the negative side of the power source (not shown). On the other hand, PNP transistors $Q_{12}$ and $Q_{22}$ constitute the output circuits respectively. Each of emitters 11 and 21 is connected in common to the positive terminal 44 of the power source through a resistance element 32. The collectors 12 and 22 of said PNP transistors are led via load resistance elements 34 and 35 to terminals 45 and 46 for the negative side of bias sources (not shown) each of which has an appropriate potential.

Electric signal inputs applied to the respective input terminals 41 and 42 are first amplified by transistors $Q_{11}$ and $Q_{21}$ respectively, then the outputs from $Q_{11}$ and $Q_{21}$ are led internally to transistors $Q_{12}$ and $Q_{22}$ respectively and further amplified. The final outputs are taken out from the output terminals 47 and 48 provided at each of the collectors 12 and 22. Both the said transistors $Q_{11}$ and $Q_{21}$ on the input side are of planar type and function well enough to provide signal amplification. Both the output-side transistors $Q_{12}$ and $Q_{22}$ have the lateral structure. Since $Q_{12}$ or $Q_{22}$ has a current amplification factor of 2–3, the final current amplification factor obtainable by combination with transistor $Q_{11}$ or $Q_{21}$ of planar structure can attain a very large value.

For the above reasons, this circuit is superior to the conventional differential amplifier provided with one transistor on each of the right and left sides, in respect of the current amplification factor. This in turn results in such advantages as lowering the resistance values of elements 32 through 34 and reducing the input current drift by reducing the input base current of $Q_{11}$ and $Q_{21}$. Furthermore, notwithstanding the fact that this differential amplifier employs four transistors in all, only transistors $Q_{11}$ and $Q_{21}$ are responsive to input voltage drift. Because only said $Q_{11}$ and $Q_{21}$ form the input circuit, only these transistors may be responsive to temperature variation with respect to the input voltage drift. This condition is identical with that in an ordinary differential amplifier having one transistor on each of the right and the left sides. According to the present invention, the increase in number of transistors gives no unfavorable influence upon the differential amplifier whereas the Darlington configuration increases the voltage drift. Thus, application of the invention provides a more stable differential amplifier with less drift both in input current and input voltage. Another advantage of this invention is that the level shift between the input and the output signal can be easily adjusted to be either negative or positive through the combination of the PNP type and NPN type transistors.

In FIG. 10, a device wherein a differential amplifier such as shown schematically in FIG. 9, is assembled on a single semiconductor substrate formed by one block, and is shown in a plan view for example. In FIG. 10 the same designations are used as were used in FIG. 7 to identify corresponding parts, for easy understanding. A monoblock circuit of transistors $Q_{11}$ and $Q_{12}$ is disposed in a first isolated bulk region 50, and the other monoblock circuit formed by transistors $Q_{21}$ and $Q_{22}$ is disposed in a second isolated bulk region 51. Resistance elements 32, 33, 34, and 35 are disposed in a third isolated region 52. All of said isolated bulk regions are provided on the surface of one semiconductor substrate 53, and each of them is electrically isolated from other regions by means of P-N junctions. Electrical connections necessary for interconnection among said electric elements are accomplished with conductors such as aluminum. The surface of a monoblock-circuit device as shown in FIG. 10 is coated by an oxide film provided with electric insulation properties. The connecting conductors are provided in the state in which they adhere to said film coating, and are connected by ohmic contacts to only the electric circuit-elements previously prescribed, through the coating. In the drawing, portions where said ohmic contacts are employed, are shown by the black section.

The differential amplifier comprising the embodiments of this invention heretofore described is an example illustrating a device wherein each monoblock circuit comprised of a PNP type and of an NPN type transistor, is formed on each isolated surface bulk region which is separated from each other on a semiconductor substrate. According to this invention, however, if plural elements formed in an epitaxial layer 101 are separated electrically by the use of the sheet resistance of said epitaxial layer 101, every pair of said monoblock circuits can be accommodated into one isolated surface bulk region. In such case, the sheet resistance of said epitaxial layer 101 is made as highly resistive as possible, and only a prescribed region on the main face of the substrate 100 is processed by diffusion of N type impurity with high concentration in advance of the epitaxial growth so that a low resistance layer, called the buried layer, may be formed. Thus the sheet resistance of said epitaxial layer 101 is reduced equivalently in effect only at portions closely adjacent to said buried layer.

FIG. 11 shows an embodiment of the invention mentioned in the preceeding paragraph. Referring to FIG. 11 of the drawings, 200 is a P-type semiconductor substrate, and 201 is an N-type layer disposed on the surface of said P-type semiconductor substrate 200. A barrier region 202 is extended to the basic substrate penetrating through said N-type layer 201, and an N-type surface bulk region **201*a* which is isolated by a P-N junction 203 is disposed on said semiconductor substrate. The P-type barrier region 202 is formed by impurity diffusion in the previously described manner. Portions 204*a*, 204*b*, 204*c*, 204*d*, and 204*e* are the regions of P-type conductivity which are formed in the same impurity diffusion process and aligned on the surface portion of said N-type surface bulk region 201*a*. They are disposed symmetrically with region 204*a* as the center pairing with 204*b* for 204*d*, and 204*c* for 204*e*. Further, for regions 204*c* and 204*e*, region of N-type conductivity 205*a* and 205*b* are provided by diffusing N-type impurity thereinto so that said region 205*a* will be disposed in said region 204*c*, and 205*b* in 204*e***.

As shown in the drawing, the above described semiconductor structure has a form of symmetrical conductivity region disposition with axis B–B′ as the center. One half of this symmetrical disposition is identical to the device in FIG. 6 with respect to its structure. The middle region **204*a* with P-type conductivity offers a common region to each of half sections on the right and left side. For this surface bulk region 201*a*, a sheet resistance of comparatively high value is provided. By providing N-type regions 201*b* and 201*c* with high impurity-concentration, a high resistance channel portion brought by an N-type bulk region 201′ appears just under the P-type region 204*a* so that the bulk region is substantially separated into two sections. To define this channel portion, regions 201*b* and 201*c* are disposed in such manner that they come into contact with the bottom of said bulk region 201*a* and are separated from each other at a point corresponding to the middle of said P-type region 204*a*. It is also effective to have a N-type region with high impurity-concentration similar to 201*c* or 201*b*** at the botom of N-type bulk region in FIG. 6.

In case some potential difference is produced between both bulk regions on the right and left sides, each side only accepts a very little potential effect which has been extremely attenuated due to the existence of the high resistance portion as mentioned above, from the opposite side separated at B–B′. Accordingly, the voltage applied to the P–N junction formed between the P-type region **204*a* and the N-type bulk region 201′ is not equal with respect to the right and the left half. As known, the amount of injected carriers varies exponentially subject to the junction potential. Hence the injunction of carriers from said P-type region 204*a*** occurs almost independently on each of the right and left sides, according to the collector potentials of the planar transistors corresponding to each other.

In order to improve the separation between monoblock circuit components on the right and left sides of a differential amplifier of the aforesaid structure employing one isolated bulk region, it is desired that the common emitter region **204*a*** of the lateral transistor be made slender, and the sheet resistance laying just under the said emitter region be made high. Such pattern is shown in plan in FIG. 12 for example.

FIG. 13 shows an example wherein the invention is fabricated in the form of a logic circuit. The state or disposition for each conductivity type region arranged in a semiconductor bulk region is shown by the plan view in FIG. 13. Referring to FIG. 13, 301 is a semiconductor bulk region having N-type conductivity which is isolated electrically by a P-N junction 302, and disposed on a semiconductor substrate. In said N-type bulk region, four P-type conductivity are disposed in such manner that said which are formed in the same process of P-type impurity diffusion, are disposed. Region **303*b* having P-type conductivity serves as the collector of a PNP lateral transistor. This region is disposed to surround an adjacent other P-type region 303*a* which serves as the emitter of said PNP transistor. Two other regions 304*a* and 304*b* of P-type conductivity are disposed in such manner that said PNP lateral transistor is interposed therebetween. In this design 304*a* and 304*b* are positioned symmetrically with respect to each other. Then, N-type impurity is diffused into the surfaces of said regions 304*a* and 304*b* so that N-type conductivity regions 305*a* and 305*b* may be formed. Said regions 305*a* and 305*b*** serve as the emitters of a pair of NPN planar transistors respectively.

The semiconductor device thus formed is shown in an equivalent circuit encircled by the broken line in FIG. 14, and is of monoblock construction wherein the collectors of two NPN transistors $Q_{32}$ and $Q_{33}$ are connected in common internally to the base of a PNP transistor $Q_{31}$. Accordingly, a logic circuit with two signal inputs, as shown in FIG. 14, is obtained. In this logic circuit, the emitters **305*a* and 305*b* of said NPN transistors $Q_{32}$ and $Q_{33}$ are grounded in common, the bases 304*a* and 304*b* are given signals A and B, respectively, and further the collector 303*b*** of the PNP transistor $Q_{31}$ is given a voltage V*c* through a load resistance element 311 and, at the same time, the emitter **303*a*** is given a voltage V*e*.

The logic circuit shown in FIG. 14 is operable as an OR circuit, when a signal A or B of a prescribed value is impressed on the base of at least one of two NPN transistors $Q_{32}$ and $Q_{33}$ so as to cause the NPN transistor to turn on and to deliver a signal to the collector output terminal 312. Said logic circuit in accordance with this embodiment has the advantage that no D.C. level shift can exist between the input signal and the output signal. The embodiment is illustrated with respect to a two input OR circuit; however, constitution of a logic circuit having more input terminals may be provided by arranging more NPN transistors with respect to one PNP transistor $Q_{31}$. This is performed by a means such as making the P-type region 303_a_ into strips and disposing NPN transistors along these strips. The devices heretofore described are very effective for the manufacture of a large scale integrated circuit, because all the transistor elements required can be accommodated on one isolated surface region.

A signal sharing circuit of monoblock structure, as shown in FIGS. 15 and 16, can be obtained by a structure wherein a P-type region 403 serving as the base of a planar transistor, is disposed in an N-type bulk region 401, and an N-type region 404 is disposed in said 403. Other P-type regions 403_b_, 403_d_, and 403_a_ and 403_c_, which surround 403_b_ and 403_d_, are disposed on each side of the P-type region 403 so that each pair 403_a_–403_b_ and 403_c_–403_d_, constitutes the lateral transistors $Q_{41}$ and $Q_{42}$ which employ N-type bulk region 401 in common as their bases. by this construction, when a signal is impressed upon the base 403 of the planar transistor $Q_{40}$, the signal is amplified through said planar transistor and then taken out from each emitter-collector circuit of the two lateral transistors $Q_{41}$ and $Q_{42}$. In this structure, emitter regions 403_b_ and 403_d_ are encircled, as in FIG. 15, by the collector regions 403_a_ and 403_c_, respectively, of each of the lateral transistors $Q_{41}$ and $Q_{42}$, and this disposition enables each of two lateral transistors to operate independently without mutual electric interference.

From the foregoing descriptions it will be appreciated that according to this invention, a monoblock circuit device can be comprised on one semiconductor bulk region by employing a monoblock device design wherein at least one planar transistor and at least one lateral transistor which are of opposite conductivity type, are provided, and the integrated circuit is comprised in such manner that the collector output of said planar transistor is internally supplied to the base of the lateral transistor. Also, by reason of the present invention, the number of bulk regions which are to be used in forming the semiconductor device can be reduced so as to make it possible to construct the device very small.

Having described several embodiments of a monolithic semiconductor circuit device constructed in accordance with the invention, it is believed obvious that other modifications and variations of the present invention are possible in the light of the above teachings. It is therefore to be understood that changes may be made in the particular embodiments of the invention described which are within the full intended scope of the invention as defined by the appended claims.

I claim:

1. A semiconductor signal distributor comprising:

(1) a semiconductor layer of a first conductivity type having a planar surface;

(2) a singular third and a plurality of pairs of first and second laterally adjacent diffused surface regions of a second conductivity type opposite to said first conductivity type disposed in said semiconductor layer, each of said second regions being laterally interlaid substantially between its corresponding first region and said third region with a closer lateral distance from said first region than that from said third region, so that respective pairs of first and second regions and portions of said semiconductor layer interlaid, respectively, between said first and second regions form a plurality of lateral transistors wherein said first and second regions serve as the emitter and collector regions and said portions of the semiconductor layer serve as the base region, respectively;

(3) a fourth region of said first conductivity type diffused in said third region, said third and fourth regions and said semiconductor layer forming a singular planar transistor of opposite polarity to that of said lateral transistors wherein said third and fourth regions serve as the base emitter regions and said semiconductor layer serves as the collector region, which is interconnected by the semiconductor layer with the respective base regions of said lateral transistors;

(4) a first conductor means associated with each of said respective first regions to form respective emitter electrodes of said plural lateral transistors;

(5) a second conductor means associate with each of said respective second regions to form respective collector electrodes of said plural lateral transistors;

(6) third conductor means associated with said third region to form a base electrode of said planar transistor; and (7) fourth conductor means associated with said fourth region to form an emitter electrode of said planar transistor; whereby output signals are obtainable between the emitter and collector electrodes of the respective lateral transistors each responsive to input a signal applied at said base electrodes of said planar transistor.

2. A semiconductor integrated circuit device containing a lateral transistor and a plurality of planar transistors whose collectors are commonly interconnected with the base region of said lateral transistor, which comprises:

(1) a semiconductor layer of a first conductivity type having a planar surface;

(2) a first, a second and a plurality of third laterally adjacent surface regions of a second conductivity type opposite to said first conductivity type disposed in said semiconductor layer, said second region being laterally interlaid substantially between said first and said third regions with a closer lateral distance from said first region than that from said third regions, so that said first and second regions and a portion of said semiconductor layer interlaid between said first and second regions form a single lateral transistor wherein said first and second regions and said semiconductor layer serve as the emitter, collector and base regions, respectively;

(3) a fourth region of said first conductivity type diffused in each of said third regions, respectively, said third and fourth regions and said semiconductor layer forming a plurality of planar transistors of opposite polarity to that of said lateral transistor wherein said third and fourth regions serve as the base and emitter regions of the respective planar transistors and said semiconductor layer serves as the common collector region of said respective planar transistors, said common collector region being interconnected by said semiconductor layer with the base region of said single lateral transistor;

(4) first means connected with said emitter region of said lateral transistor for supplying thereto a first emitter bias voltage;

(5) second means connected with said emitter regions of said planar transistors for supplying thereto a second emitter bias voltage in common;

(6) load impedance means having two terminals;

(7) third means for connecting said collector region of said lateral transistor to one of the terminals of said load impedance means;

(8) fourth means connected with the other one of the terminals of said load impedance means for supplying a collector bias voltage to the collector of said lateral transistor through said load impedance means;

(9) fifth means connected with respective base regions of said planar transistors for supplying input signals thereto, respectively; and

(10) seventh means connected with said third means for deriving an output signal therefrom; thereby providing the integrated circuit device with the function of OR gate.

3. A semiconductor integrated circuit device as defined in claim 2 wherein said second region is disposed to separate laterally said first region from said plural third regions.

4. A semiconductor integrated circuit device as defined in claim 3 wherein said second region is in a shape surrounding the outer periphery of said first region and said third regions are arranged along the outer periphery of said second region with the same distance therebetween.

5. A semiconductor integrated circuit device containing two pairs of integrated transistors, each pair including a planar and a lateral transistor of opposite polarity to each other, which comprises:

(1) a substrate having a planar surface in which at least two semiconductor layers of a first conductivity type are disposed separately from each other, each of said semiconductor layers having at least first, second and third laterally adjacent surface regions of a second conductivity type opposite to said first conductivity type and a fourth surface region of said first conductivity type diffused in said third region, said second region being laterally interlaid substantially between said first and third regions with a closer lateral distance from said first region than that from said third region, so that said first and second regions and a portion of said semiconductor layer interlaid between said first and second regions form a lateral transistor wherein said first and second regions and said semiconductor layer serve as the emitter, collector and base regions of the lateral transistor, respectively, while said third and fourth regions and said semiconductor layer form a planar transistor of a polarity opposite to that of said lateral transistor wherein said third and fourth regions and said semiconductor layer serve as the base, emitter and collector regions, respectively, the collector of said planar transistor being internally connected with the base of said lateral transistor in each semiconductor layer;

(2) first means connected with the respective base regions of said planar transistors for supplying input signals thereto, respectively;

(3) first and second impedance elements each having two terminals;

(4) second means for connecting said emitter regions of both of said lateral transistors in common to one of the terminals of said first impedance element;

(5) third means connected with the other one of the terminals of said first impedance element for supplying a first emitter bias voltage to the respective emitters of said lateral transistors through said first impedance element;

(6) fourth means for connecting said emitter regions of both of said planar transistors in common to one of the terminals of said second impedance element;

(7) fifth means connected with the other one of the terminals of said second impedance element for supplying a second emitter bias voltage to the respective emitters of said planar transistors through said impedance element;

(8) a pair of load impedance elements;

(9) sixth of seventh means connecting the collector regions of said respective lateral transistors to said load impedance elements, respectively; and

(10) eighth and ninth means connected with said respective load impedance element for supplying a collector bias voltage therethrough to said collectors of the lateral transistors, respectively; thereby output signals can be derived from the respective sixth and seventh means.

6. A semiconductor integrated circuit device as defined in claim 5, wherein said substrate is of a semiconductor mono-crystalline material of the second conductivity type, and said semiconductor layers are isolated from each other by P-N junctions, formed by said respective semiconductor layers and said substrate, which extend to the planar surface of said substrate.

7. A semiconductor integrated circuit device in accordance with claim 6, wherein said substrate further includes at least one semiconductor isolated layer, in which said emitter impedance elements and said load impedance elements are composed of diffused semiconductor regions of the second conductivity type.

8. A semiconductor differential amplifier device including two of integrally connected transistor pairs formed in a common semiconductive layer, each of said transistor pairs having lateral and planar transistors of opposite polarity to each other with an internal connection between the collector of the planar transistor and the base of the lateral transistor, which comprises:

(1) a substrate having a planar surface in which said semiconductive layer is disposed, said semiconductive layer being of a first conductivity type and having a channel portion of a sufficient sheet resistance to divide, substantially, said semiconductive layer into two parts thereof;

(2) a first surface region of a second conductive type opposite to said first conductivity type diffused in said semiconductive layer so as to be laterally extended from one to the other of the respective divided parts of said semiconductive layer across said channel portion;

(3) two second and two third surface regions of the second conductivity type diffused in respective divided parts of said semiconductive layer in such a manner that each divided part includes the second and third region pair and each of said second regions is laterally interlaid substantially between said first and third regions with a closer lateral distance from said first region than that from second region, respectively, said first and second regions and said respective divided parts of the semiconductive layer forming a pair of lateral transistors of a first polarity wherein said first region serves as a common emitter region of the pair of lateral transistors, said second regions serve as respective base regions and said divided parts serve as respective base regions;

(4) a plurality of fourth regions of said first conductivity type diffused in said third regions, respectively, said third and fourth regions and said respective divided parts of said semiconductive layer forming a pair of planar transistors of a second polarity opposite to said first polarity wherein said third regions serve as respective base regions, said fourth regions serve as respective emitter regions and said divided parts serve as respective collector regions internally connected to said bases of said lateral transistors, respectively;

(5) first conductor means connected with the respective base regions of said planar transistors for supplying input signals thereto, respectively;

(6) first and second emitter impedance elements;

(7) second conductor means for connecting said emitter regions of both of said lateral transistors in common to one of the terminals of said first impedance element;

(8) third conductor means connected with the other one of the terminals of said first impedance element for supplying a first emitter bias voltage to the respective emitters of said lateral transistors through said first impedance element;

(9) fourth conductor means for connecting said emitter regions of both of said planar transistors in common to one of the terminals of said second impedance element;

(10) fifth conductor means connected with the other one of the terminals of said second impedance element for supplying a second emitter bias voltage to the respective emitters of said planar transistors through said second impedance element;

(11) a pair of load impedance elements;

(12) sixth and seventh conductor means connecting the collector regions of the respective planar transistor to said load impedance elements, respectively; and

(13) eighth conductor means connected with said load impedance elements, respectively, for supplying a collector bias voltage therethrough to said collectors of the lateral transistors, respectively; whereby output signals can be derived from the respective sixth and seventh conductor means.

9. A semiconductor integrated circuit device as defined in claim 8 wherein said first region is in the form of a strip and plural second, third and fourth regions are arranged along said second region at one side thereof with the same distance therebetween.

10. A semiconductor differential amplifier device in accordance with claim 8, wherein said first and second emitter impedance elements and said pair of load impedance elements are disposed in the planar surface of said substrate.

11. A semiconductor differential amplifier device in accordance with claim 8, wherein said substrate is of semiconductive material having the second conductivity type and forms a P-N junction with said semiconductive layer to provide isolation of said semiconductive layer from said substrate.

12. A semiconductor differential amplifier device in accordance with claim 11, which further comprises another isolated semiconductive layer of the first conductivity type disposed in the surface of said substrate and isolated from said first mentioned semiconductive layer; and wherein said first and second emitter impedance elements and said pair of load impedance elements are formed of semiconductive regions of the second conductivity type, respectively, diffused in said another isolated semiconductor layer.

13. A semiconductor differential amplifier device in accordance with claim 11, wherein there are at least two buried semiconductive layers of said first conductivity type having an impurity concentration higher than that of said first mentioned semiconductive layer and buried in said substrate beneath said divided parts of the first mentioned semiconductive layer, so that the resistivity of the divided parts of the semiconductive layer abutting said bured layers is reduced sufficiently to internally interconnect said base region of the respective lateral transistors to said collector regions of the planar transistors while the resistivity of the sheet resistance in the channel portion is maintained sufficiently to mutually the bases of said lateral transistors from each other.

References Cited

UNITED STATES PATENTS

| | | | |
|---|---|---|---|
| 3,246,214 | 4/1966 | Hugle | 317—235 |
| 3,275,846 | 9/1966 | Bailey | 307—88.5 |
| 3,319,174 | 5/1967 | Hellstrom | 330—17 |
| 3,177,414 | 4/1965 | Kurosawa et al. | 317—235 |
| 3,221,215 | 11/1965 | Osafune et al. | 317—101 |
| 3,380,153 | 4/1968 | Husker et al. | 317—235X |

JAMES D. KALLAM, Primary Examiner

U.S. Cl. X.R.

330—30; 307—213, 303; 317—235, 234